(12) United States Patent
Kim (10) Patent No.: US 8,791,495 B2
(45) Date of Patent: Jul. 29, 2014

(54) LIGHT EMITTING DEVICE PACKAGE AND LIGHTING SYSTEM

(75) Inventor: Geun Ho Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 97 days.

(21) Appl. No.: 12/984,369

(22) Filed: Jan. 4, 2011

(65) Prior Publication Data

US 2011/0198643 A1    Aug. 18, 2011

(30) Foreign Application Priority Data

Jan. 5, 2010    (KR) .................. 10-2010-0000486

(51) Int. Cl.
*H01L 33/48* (2010.01)
*H01L 33/50* (2010.01)
*H01L 33/56* (2010.01)

(52) U.S. Cl.
CPC .............................. *H01L 33/505* (2013.01); *H01L 33/56* (2013.01)
USPC  257/100; 257/98; 257/E33.059; 257/E33.061; 438/25; 438/27

(58) Field of Classification Search
CPC .............................. H01L 33/505; H01L 33/56
USPC ................... 257/98, 100, E33.059, E33.061; 438/26, 27
See application file for complete search history.

(56) References Cited

U.S. PATENT DOCUMENTS

| | | | |
|---|---|---|---|
| 7,279,724 B2* | 10/2007 | Collins et al. ................. | 257/103 |
| 7,495,325 B2* | 2/2009 | Abela ........................... | 257/680 |
| 7,728,344 B2 | 6/2010 | Chang et al. | |
| 7,762,692 B2 | 7/2010 | Lai et al. | |
| 7,910,940 B2* | 3/2011 | Koike et al. ..................... | 257/98 |
| 2004/0150991 A1 | 8/2004 | Ouderkirk et al. | |
| 2005/0253130 A1 | 11/2005 | Tsutsumi et al. | |
| 2006/0255353 A1* | 11/2006 | Taskar et al. .................... | 257/98 |
| 2007/0058059 A1* | 3/2007 | Suehiro ........................ | 348/294 |
| 2008/0210965 A1* | 9/2008 | Hung ............................. | 257/98 |
| 2008/0224162 A1* | 9/2008 | Min et al. ........................ | 257/98 |
| 2009/0057699 A1* | 3/2009 | Basin et al. ...................... | 257/98 |
| 2009/0152582 A1* | 6/2009 | Chang et al. .................... | 257/98 |
| 2009/0159904 A1 | 6/2009 | Lai et al. | |
| 2009/0224177 A1 | 9/2009 | Kinomoto et al. | |
| 2009/0256166 A1* | 10/2009 | Koike et al. ..................... | 257/98 |
| 2009/0272996 A1* | 11/2009 | Chakraborty ................... | 257/98 |
| 2010/0117503 A1* | 5/2010 | Mizuno et al. ................. | 313/110 |
| 2010/0187556 A1 | 7/2010 | Kim et al. | |
| 2010/0200882 A1* | 8/2010 | Kotani et al. ................... | 257/98 |
| 2011/0001151 A1* | 1/2011 | Le Toquin ...................... | 257/98 |
| 2011/0114989 A1* | 5/2011 | Suehiro et al. ................. | 257/99 |
| 2011/0133237 A1* | 6/2011 | Koike et al. ..................... | 257/98 |
| 2011/0147778 A1* | 6/2011 | Ichikawa ........................ | 257/98 |
| 2012/0040480 A1* | 2/2012 | Shieh et al. ..................... | 438/26 |

FOREIGN PATENT DOCUMENTS

| | | |
|---|---|---|
| CN | 101022145 A | 8/2007 |
| CN | 101369619 A | 2/2009 |

(Continued)

*Primary Examiner* — Allan R Wilson
(74) *Attorney, Agent, or Firm* — Birch, Stewart, Kolasch & Birch, LLP (57) ABSTRACT

Disclosed is a light emitting device package. The light emitting device package includes a body; first and second electrode layers on the body; a light emitting device electrically connected to the first and second electrode layers on the body; a luminescent layer on the light emitting device; and an encapsulant layer including particles on the luminescent layer, wherein an effective refractive index of the encapsulant layer has a deviation of 10% or less with respect to an effective refractive index of the luminescent layer.

17 Claims, 5 Drawing Sheets

(56) References Cited

FOREIGN PATENT DOCUMENTS

| | | |
|---|---|---|
| CN | 101459163 A | 6/2009 |
| DE | 10 2007 057 812 A1 | 6/2009 |
| EP | 1 919 000 A1 | 5/2008 |
| JP | 2007-258136 A | 10/2007 |
| KR | 10-0818518 B1 | 3/2008 |
| KR | 10-2008-0056925 A | 6/2008 |
| WO | 2004/068597 A2 | 8/2004 |
| WO | 2005/027576 A2 | 3/2005 |

* cited by examiner

LIGHT EMITTING DEVICE PACKAGE AND LIGHTING SYSTEM

CROSS-REFERENCE TO RELATED APPLICATION

The present application claims priority of Korean Patent Application No. 10-2010-0000486 filed on Jan. 5, 2010, which is hereby incorporated by reference in its entirety.

BACKGROUND

The embodiment relates to a light emitting device package and a lighting system.

A light emitting diode (LED) is a semiconductor light emitting device that converts current into light. A wavelength of light emitted from the LED may vary depending on a semiconductor material used for manufacturing the LED. This is because the wavelength of the emitted light varies depending on the energy difference between valance band electrons and conduction band electrons, that is, the bandgap of the semiconductor material.

The LED can generate light having high brightness, so that the LED has been extensively used as a light source for a display device, a vehicle, or a lighting device. In addition, the LED can represent a white color having superior light efficiency by employing luminescence materials or combining LEDs having various colors.

SUMMARY

The embodiment provides a light emitting device package having a novel structure and a lighting system.

The embodiment provides a light emitting device package capable of emitting light with reduced color variation and a lighting system.

A light emitting device package according to the embodiment may include a body; first and second electrode layers on the body; a light emitting device electrically connected to the first and second electrode layers on the body; a luminescent layer on the light emitting device; and an encapsulant layer including particles on the luminescent layer, wherein an effective refractive index of the encapsulant layer has a deviation of 10% or less with respect to an effective refractive index of the luminescent layer.

A light emitting device package according to the embodiment may include a body; first and second electrode layers on the body; a light emitting device electrically connected to the first and second electrode layers on the first and second electrode layers; a luminescent layer having a uniform thickness on the light emitting device; and an encapsulant layer including particles on the luminescent layer.

A lighting system according to the embodiment may include a substrate; and at least one light emitting device package installed on the substrate to serve as a light source, wherein the light emitting device package may include a body; first and second electrode layers on the body; a light emitting device electrically connected to the first and second electrode layers on the body; a luminescent layer on the light emitting device; and an encapsulant layer including particles on the luminescent layer, and wherein an effective refractive index of the encapsulant layer has a deviation of 10% or less with respect to an effective refractive index of the luminescent layer.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device package according to embodiments will be described in detail with reference to accompanying drawings.

Figure 1:
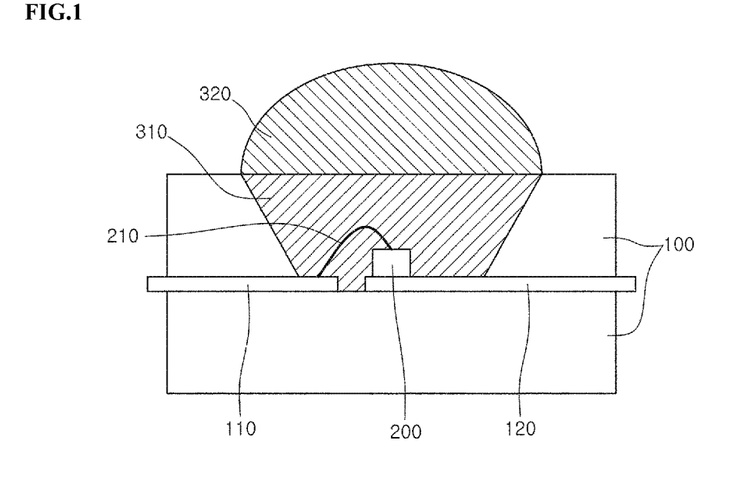
FIG. 1 is a sectional view showing a light emitting device package according to the first embodiment.

FIG. 1 is a sectional view showing a light emitting device package according to the first embodiment.

Referring to FIG. 1, the light emitting device package according to the first embodiment includes a body 100, first and second electrode layers 110 and 120 formed on the body 100, a light emitting device 200 formed on the body 100 and electrically connected to the first and second electrode layers 110 and 120, a luminescent layer 310 surrounding the light emitting device 200, and an encapsulant layer 320 formed on the luminescent layer 310.

The body 100 may include silicon, resin or a metallic material. The body 100 can be formed therein with a cavity surrounding the light emitting device 200 and having an inclined surface and a reflective layer (not shown) can be formed on the inclined surface.

The first and second electrode layers 110 and 120 are electrically isolated from each other and extend by passing through the body 100 to supply power to the light emitting device 200. In addition, the first and second electrode layers 110 and 120 may reflect the light emitted from the light emitting device 200 to improve the light efficiency or dissipate heat generated from the light emitting device 200 to the outside.

The light emitting device 200 may include a lateral type light emitting device, in which an n-side electrode layer and a p-side electrode layer are formed on a top surface of a light emitting device structure, a flip chip type light emitting device, in which the n-side electrode layer and the p-side electrode layer are formed on a bottom surface of the light emitting device structure, or a vertical type light emitting device, in which the n-side electrode layer and the p-side electrode layer are formed on the top surface and the bottom surface of the light emitting device structure, respectively. FIG. 1 shows the vertical type light emitting device, in which the n-side electrode layer of the light emitting device 200 is connected to the first electrode layer 110 through a wire 210 and the p-side electrode layer is connected to the second electrode layer 120. For instance, the light emitting device 200 may include an n type semiconductor layer, an active layer and a p type semiconductor layer.

The light emitting device 200 may be installed on the body 100 or the first or second electrode layer 110 or 120. Referring to FIG. 1, the light emitting device 200 is installed on the second electrode layer 120.

The luminescent layer 310 is formed on the body 100 to surround the light emitting device 200, and the encapsulant layer 320 is formed on the luminescent layer 310. The luminescent layer 310 converts a color of the light emitted from the light emitting device 200 and the encapsulant layer 320 protects the luminescent layer 310 and serves as a lens to control the orientation angle of the light emitted from the light emitting device 200. A top surface of the encapsulant layer 320 is convex. Thus, when the light is emitted to the outside through the encapsulant layer 320, the amount of the light totally reflected at the boundary between the encapsulant layer 320 and the outside can be reduced.

The luminescent layer 310 can be formed by distributing luminescence materials into silicon gel or epoxy. The luminescence materials may include a silicate, a phosphate, an aluminate, or a sulfide and a transition metal or a rare-earth metal is used at the center of light emission. The luminescence materials may be classified into a yellow luminescence material, a red luminescence material and a green luminescence material.

The encapsulant layer 320 can be formed by distributing high-refractive particles, which have the refractive index higher than that of silicon gel or epoxy, into the silicon gel or the epoxy.

According to the embodiment, the refractive index of the luminescent layer 310 matches with the refractive index of the encapsulant layer 320. In detail, the luminescent layer 310 has a first refractive index and the encapsulant layer 320 has a second refractive index substantially identical to the first refractive index within the deviation of 10%. For instance, if the luminescent layer 310 has the refractive index of 1.7, the encapsulant layer 320 has the refractive index of 1.53 to 1.87.

If the refractive index of the luminescent layer 310 is significantly different from the refractive index of the encapsulant layer 320, the light emitted from the light emitting device 200 may pass through the luminescent layer 310 and then is totally reflected at the boundary between the luminescent layer 310 and the encapsulant layer 320, so that the light may travel back to the luminescent layer 310 before the light is emitted to the outside. There is difference of color conversion between the light directly emitted to the outside without being totally reflected at the boundary between the luminescent layer 310 and the encapsulant layer 320 and the light emitted to the outside after being totally reflected at the boundary between the luminescent layer 310 and the encapsulant layer 320, so that the color variation of the light emitting device 200 may occur.

In this regard, according to the light emitting device package of the embodiment, the luminescent layer 310 has the refractive index identical to or similar to that of the encapsulant layer 320, thereby reducing the color variation of the light emitted from the light emitting device 200.

For instance, the luminescent layer 310 can be formed by mixing the silicon gel having the refractive index of 1.4 to 1.6 with the YAG-based luminescence material having the refractive index of about 1.8 or the silicate-based luminescence material having the refractive index of about 2.0. The luminescent layer 310 may have the effective refractive index of about 1.6 to 1.8. Meanwhile, the encapsulant layer 320 can be formed by using the silicon gel having the refractive index of 1.4 to 1.6. In this case, the amount of the light totally reflected from the boundary between the luminescent layer 310 and the encapsulant layer 320 may increase due to the difference in the refractive index.

In this regard, according to the embodiment, particles are added to the encapsulant layer 320 in such a manner that the encapsulant layer 320 may have the effective refractive index similar to the effective refractive index of the luminescent layer 310.

The particles may include high-refractive particles. For instance, the particles may include at least one of metal oxide, $TiO_2$, $Al_2O_3$, $TaO_2$, $CeO_2$ and silica. If the particles are added to the encapsulant layer 320, the effective refractive index of the encapsulant layer 320 may increase to 1.44 to 1.98.

Therefore, the luminescent layer 310 may have the refractive index identical to or similar to the refractive index of the encapsulant layer 320, so that the total reflection may rarely occur at the boundary between the luminescent layer 310 and the encapsulant layer 320, thereby reducing the color variation of the light emitted from the light emitting device 200.

Figure 2:
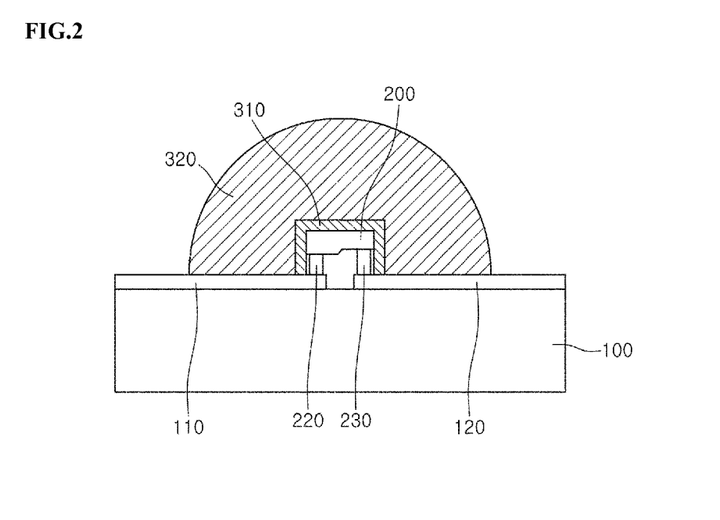
FIG. 2 is a sectional view showing a light emitting device package according to the second embodiment.

FIG. 2 is a sectional view showing a light emitting device package according to the second embodiment.

In the following description of the second embodiment, details of elements and structures that have been described in the first embodiment will be omitted in order to avoid redundancy.

Referring to FIG. 2, the light emitting device package according to the second embodiment includes a body 100, first and second electrode layers 110 and 120 formed on the body 100, a light emitting device 200 formed on the body 100 and electrically connected to the first and second electrode layers 110 and 120, a luminescent layer 310 surrounding the light emitting device 200, and an encapsulant layer 320 formed on the luminescent layer 310.

The body 100 has a flat top surface and a reflective layer (not shown) may be formed on the top surface of the body 100. In addition, the first and second electrode layers 110 and 120 may serve as the reflective layer.

The light emitting device 200 may include a flip chip type light emitting device electrically connected to the first and second electrode layers 110 and 120 through first and second bumps 220 and 230.

The luminescent layer 310 can be formed around the light emitting device 200 with a substantially uniform thickness. In detail, the luminescent layer 310 can be formed through a conformal coating process. In addition, the luminescent layer 310 can be prepared as a film including luminescence materials.

The encapsulant layer 320 may be formed on the luminescent layer 310, the first electrode layer 110 and the second electrode layer 120.

Since the luminescent layer 310 is formed through the conformal coating process, the light emitted from the light emitting device 200 may pass through the luminescent layer 310 having the uniform thickness, so that the color variation can be reduced. However, even when the luminescent layer 310 has the uniform thickness, if there is great difference in the refractive index between the luminescent layer 310 and the encapsulant layer 320, some of the light emitted from the light emitting device 200 is totally reflected at the boundary between the luminescent layer 310 and the encapsulant layer 320, so that the light may travel back to the luminescent layer 310 before the light is emitted to the outside. Thus, there is limitation to reduce the color variation of the light emitted from the light emitting device 200 even if the luminescent layer 310 is formed through the conformal coating process.

As described above in the first embodiment, the encapsulant layer 320 is formed by distributing high-refractive particles so that the encapsulant layer 320 may have the effective refractive index similar to the effective refractive index of the luminescent layer 310.

In addition, according to the light emitting device package of the embodiment, the refractive index of the luminescent layer 310 matches with the refractive index of the encapsulant layer 320, so that the amount of the light totally reflected at the boundary between the luminescent layer 310 and the encapsulant layer 320 may be reduced.

Figure 3:
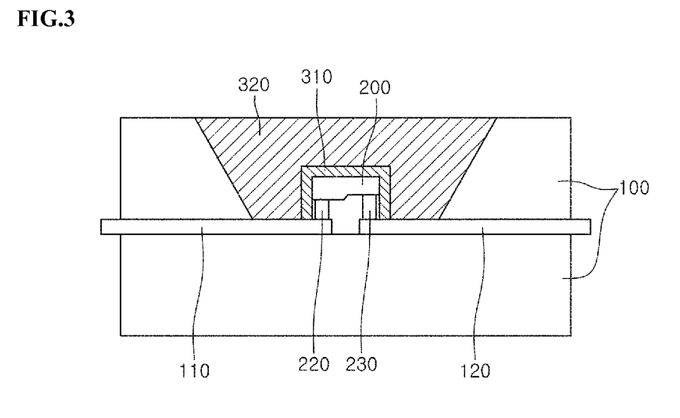
FIG. 3 is a sectional view showing a light emitting device package according to the third embodiment.

FIG. 3 is a sectional view showing a light emitting device package according to the third embodiment.

In the following description of the third embodiment, details of elements and structures that have been described in the first and second embodiments will be omitted in order to avoid redundancy.

Referring to FIG. 3, the light emitting device package according to the third embodiment includes a body 100, first and second electrode layers 110 and 120 formed on the body 100, a light emitting device 200 formed on the body 100 and electrically connected to the first and second electrode layers 110 and 120, a luminescent layer 310 surrounding the light emitting device 200, and an encapsulant layer 320 formed on the luminescent layer 310.

The body 100 may include an inclined surface formed around the light emitting device 200 and a reflective layer (not shown) can be formed on the inclined surface.

The first and second electrode layers 110 and 120 are electrically isolated from each other and extend by passing through the body 100 to supply power to the light emitting device 200. In addition, the first and second electrode layers 110 and 120 may reflect the light emitted from the light emitting device 200 to improve the light efficiency or dissipate heat generated from the light emitting device 200 to the outside.

The light emitting device 200 may include a flip chip type light emitting device electrically connected to the first and second electrode layers 110 and 120 through first and second bumps 220 and 230.

The luminescent layer 310 can be formed around the light emitting device 200 with a substantially uniform thickness. In detail, the luminescent layer 310 can be formed through a conformal coating process. In addition, the luminescent layer 310 can be prepared as a film including luminescence materials.

The encapsulant layer 320 may be formed on the luminescent layer 310, the first electrode layer 110 and the second electrode layer 120. The encapsulant layer 320 is formed in the cavity defined in the body 100 and has a flat top surface.

Since the encapsulant layer 320 includes particles, the light passing through the encapsulant layer 320 may be scattered at an arbitrary angle even if the encapsulant layer 320 has the flat top surface, so that the amount of the light totally reflected at the boundary between the encapsulant layer 320 and an external air layer can be reduced, thereby improving the light efficiency.

Similar to the previous embodiments, according to the light emitting device package of the third embodiment, the refractive index of the luminescent layer 310 matches with the refractive index of the encapsulant layer 320, so that the amount of the light totally reflected at the boundary between the luminescent layer 310 and the encapsulant layer 320 may be reduced.

The encapsulant layer 320 may be formed by distributing high-refractive particles such that the encapsulant layer 320 may have the effective refractive index similar to the effective refractive index of the luminescent layer 310. Thus, the light passing through the encapsulant layer 320 may be scattered at the arbitrary angle.

Figure 4:
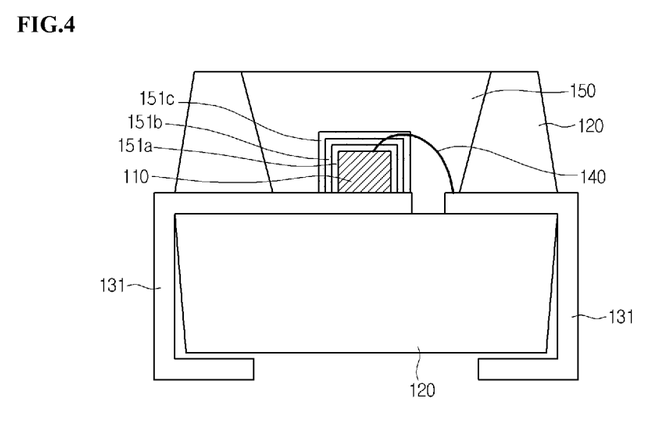
FIG. 4 is a sectional view showing a light emitting device package according to the fourth embodiment.

FIG. 4 is a sectional view showing a light emitting device package according to the fourth embodiment.

In the following description of the fourth embodiment, details of elements and structures that have been described in the first to third embodiments will be omitted in order to avoid redundancy.

Referring to FIG. 4, the light emitting device package according to the fourth embodiment includes a body 120, first and second electrode layers 131 formed on the body 120, a light emitting device 110 formed on the body 120 and electrically connected to the first and second electrode layers 131, a luminescent layer 151 surrounding the light emitting device 110, and an encapsulant layer 150 surrounding the luminescent layer 151.

The body 120 can be formed therein with a cavity surrounding the light emitting device 110 and having an inclined surface and a reflective layer (not shown) can be formed on the inclined surface.

The first and second electrode layers 131 are electrically isolated from each other and extend by passing through the body 120 to supply power to the light emitting device 110.

The light emitting device 100 may be formed on the body 120, the first electrode layer or the second electrode layer 131.

The luminescent layer 151 may include a first luminescent layer 151a disposed on a top surface and lateral sides of the light emitting device 110 to surround the light emitting device 110, a second luminescent layer 151b disposed on the first luminescent layer 151a corresponding to the top surface and lateral sides of the light emitting device 110 to surround the light emitting device 110, and a third luminescent layer 151c disposed on the second luminescent layer 151b corresponding to the top surface and lateral sides of the light emitting device 110 to surround the light emitting device 110. The first to third luminescent layers 151a to 151c are formed around the light emitting device 110 with a substantially uniform thickness. In addition, the first to third luminescent layers 151a to 151c may include at least one selected from the group consisting of oxynitride-based luminescence materials, YAG-based luminescence materials, nitride-based luminescence materials, and silicate-based luminescence materials.

The encapsulant layer 150 may be formed on the luminescent layer 151, the first electrode layer and the second electrode layer 131. The encapsulant layer 150 is formed in the cavity defined in the body 120 and has a flat top surface.

Since the encapsulant layer 150 includes particles, the light passing through the encapsulant layer 150 may be scattered at an arbitrary angle even if the encapsulant layer 150 has the flat top surface, so that the amount of the light totally reflected at the boundary between the encapsulant layer 150 and an external air layer can be reduced, thereby improving the light efficiency.

Similar to the previous embodiments, according to the light emitting device package of the fourth embodiment, the refractive index of the luminescent layer 151 matches with the refractive index of the encapsulant layer 150, so that the amount of the light totally reflected at the boundary between the luminescent layer 151 and the encapsulant layer 150 may be reduced.

Figure 5:
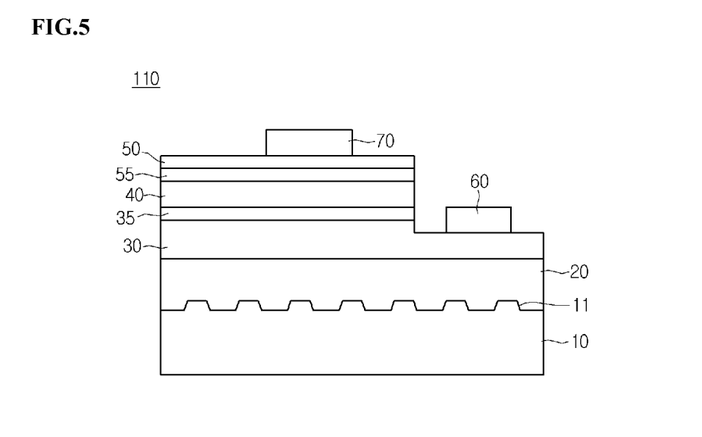
FIG. 5 is a section view showing an example of a light emitting device used in a light emitting device package according to the embodiments.

FIG. 5 is a section view showing an example of the light emitting device used in the light emitting device package according to the embodiments.

Referring to FIG. 5, the light emitting device 110 includes a substrate 10, an undoped semiconductor layer 20 on the substrate 10, a light emitting structure layer formed on the undoped semiconductor layer 20 and having a first conductive semiconductor layer 30, an active layer 40 and a second conductive semiconductor layer 50, a first electrode 60 on the first conductive semiconductor layer 30, and a second electrode 70 on the second conductive semiconductor layer 50.

In addition, a first conductive InGaN/GaN superlattice structure or an InGaN/InGaN superlattice structure 35 may be formed between the first conductive semiconductor layer 30 and the active layer 40.

Further, a second conductive AlGaN layer 55 can be formed between the second conductive semiconductor layer 50 and the active layer 40.

For instance, the substrate 10 may include at least one of $Al_2O_3$, single crystalline, SiC, GaAs, GaN, ZnO, AlN, Si, GaP, InP and Ge substrates, but the embodiment is not limited thereto. For example, the substrate 10 may include a sapphire substrate serving as a growth substrate for the light emitting structure layer.

A plurality of protrusion patterns 11 may be formed on the substrate 10. The protrusion patterns 11 may scatter the light emitted from the active layer 40 to improve the light efficiency.

For instance, the protrusion patterns 11 may have the shape including one of a hemispherical shape, a polygonal shape, a triangular pyramid shape and a nano-column shape.

Although the undoped semiconductor layer 20 is not intentionally doped with first conductive impurities, the undoped semiconductor layer 20 is a nitride layer having a first conductive conduction property. For instance, the undoped semiconductor layer 20 may include an undoped-GaN layer. A buffer layer can be formed between the undoped semiconductor layer 20 and the substrate 10. In addition, the undoped semiconductor layer 20 may be omitted.

For example, the first conductive semiconductor layer 30 may include an N type semiconductor layer. The first conductive semiconductor layer 20 may include a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 30 may be selected from the group consisting of InAlGaN, GaN, AlGaN, AlInN, InGaN, AlN, and InN, and may be doped with N type dopant, such as Si, Ge or Sn.

The active layer 40 emits the light based on the band gap difference of the energy band according to material constituting the active layer 40 through the recombination of electrons (or holes) injected through the first conductive semiconductor layer 30 and holes (or electrons) injected through the second conductive semiconductor layer 50.

The active layer 40 may have a single quantum well structure, a multiple quantum well (MQW) structure, a quantum dot structure, or a quantum wire structure, but the embodiment is not limited thereto.

The active layer 40 may include a semiconductor material having a compositional formula of $In_xAl_yGa_{1-x-y}N$ ($0 \leq x \leq 1$, $0 \leq y \leq 1$, $0 \leq x+y \leq 1$). If the active layer 40 has the MQW structure, the active layer 40 may have a stack structure of a plurality of well layers and a plurality of barrier layers. For example, the active layer 40 may include a stack structure of InGaN well/GaN barrier layers.

A clad layer (not shown) doped with N type dopant or P type dopant may be formed on and/or under the active layer 40. The clad layer may include an AlGaN layer or an InAlGaN layer.

For example, the second conductive semiconductor layer 50 may include a P type semiconductor layer. The second conductive semiconductor layer 50 may include a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 50 may be selected from the group consisting of InAlGaN, GaN, AlGaN, InGaN, AlInN, AlN, and InN. The second conductive semiconductor layer 50 may be doped with P type dopant, such as Mg, Zn, Ca, Sr, and Ba.

Meanwhile, the first conductive semiconductor layer 30 may include a P type semiconductor layer, and the second conductive semiconductor layer 50 may include an N type semiconductor layer. In addition, a third conductive semiconductor layer (not shown) including an N type semiconductor layer or a P type semiconductor layer may be formed on the second conductive semiconductor layer 50. Accordingly, the light emitting structure layer may include at least one of an NP, PN, NPN, PNP junction structures. In addition, the doping concentration of impurities in the first and second conductive semiconductor layers 30 and 50 may be uniform or irregular. In other words, the light emitting structure layer may have various structures, and the embodiment is not limited thereto.

The first electrode 60 is disposed on the first conductive semiconductor layer 30 and the second electrode 70 is disposed on the second conductive semiconductor layer 50 to supply power to the active layer 40.

Figure 6:
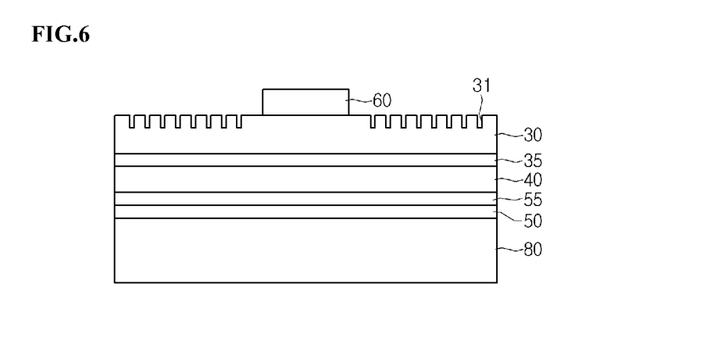
FIG. 6 is a section view showing another example of a light emitting device used in a light emitting device package according to the embodiments.

FIG. 6 is a section view showing another example of the light emitting device used in the light emitting device package according to the embodiments.

Referring to FIG. 6, the light emitting device includes a conductive support substrate 80, a light emitting structure layer formed on the conductive support substrate 80 and having a first conductive semiconductor layer 30, an active layer 40 and a second conductive semiconductor layer 50, and a first electrode 60 on the first conductive semiconductor layer 30.

In addition, a first conductive InGaN/GaN superlattice structure or an InGaN/InGaN superlattice structure 35 may be formed between the first conductive semiconductor layer 30 and the active layer 40.

Further, a second conductive AlGaN layer 55 can be formed between the second conductive semiconductor layer 50 and the active layer 40.

In addition, a light extracting structure 31 prepared in the form of a column or a hole can be formed on the first conductive semiconductor layer 30. The light emitted from the active layer 40 can be effectively discharged to the outside due to the light extracting structure 31.

For example, the light extracting structure 31 may have one of a hemispherical shape, a polygonal shape, a triangular pyramid shape, and a nano-column shape. The light extracting structure 31 may include a photonic crystal.

The conductive support substrate 80 supports the light emitting structure layer and supplies power to the light emitting structure layer together with the first electrode 60.

The conductive support substrate 80 may include a support layer, a reflective layer and an ohmic contact layer. The support layer may include at least one of Cu, Au, Ni, Mo, a Cu—W alloy and a carrier wafer including Si, Ge, GaAs, ZnO or SiC.

The reflective layer may include a metal, such as Ag or Al. In addition, the ohmic contact layer may include a material that makes an ohmic contact with respect to the second conductive semiconductor layer 50. For instance, the ohmic contact layer can be prepared as a single layer or a multiple layer by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x/ITO$, Ni, Ag, $Ni/IrO_x/Au$, and $Ni/IrO_x/Au/ITO$.

The light emitting structure layer may include a plurality of group III to V compound semiconductor layers.

For example, the first conductive semiconductor layer 30 may include an N type semiconductor layer. The first conductive semiconductor layer 20 may include a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 30 may be selected from the group consisting of InAlGaN, GaN, AlGaN, AlInN, InGaN, AlN, and InN, and may be doped with N type dopant, such as Si, Ge or Sn.

The active layer 40 emits the light based on the band gap difference of the energy band according to material constituting the active layer 40 through the recombination of electrons (or holes) injected through the first conductive semiconductor layer 30 and holes (or electrons) injected through the second conductive semiconductor layer 50.

The active layer 40 may have a single quantum well structure, a multiple quantum well (MQW) structure, a quantum dot structure, or a quantum wire structure, but the embodiment is not limited thereto.

The active layer 40 may include a semiconductor material having a compositional formula of $In_xAl_yGa_{1-x-y}N$ ($0 \leq x \leq 1$, $0 \leq y \leq 1$, $0 \leq x+y \leq 1$). If the active layer 40 has the MQW structure, the active layer 40 may have a stack structure of a plurality of well layers and a plurality of barrier layers. For example, the active layer 40 may include a stack structure of InGaN well/GaN barrier layers.

A clad layer (not shown) doped with N type dopant or P type dopant may be formed on and/or under the active layer 40. The clad layer may include an AlGaN layer or an InAlGaN layer.

For example, the second conductive semiconductor layer 50 may include a P type semiconductor layer. The second conductive semiconductor layer 50 may include a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 50 may be selected from the group consisting of InAlGaN, GaN, AlGaN, InGaN, AlInN, AlN, and InN. The second conductive semiconductor layer 50 may be doped with P type dopant, such as Mg, Zn, Ca, Sr, and Ba.

Meanwhile, the first conductive semiconductor layer 30 may include a P type semiconductor layer, and the second conductive semiconductor layer 50 may include an N type semiconductor layer. In addition, a third conductive semiconductor layer (not shown) including an N type semiconductor layer or a P type semiconductor layer may be formed on the second conductive semiconductor layer 50. Accordingly, the light emitting structure layer may include at least one of an NP, PN, NPN, PNP junction structures. In addition, the doping concentration of impurities in the first and second conductive semiconductor layers 30 and 50 may be uniform or irregular. In other words, the light emitting structure layer may have various structures, and the embodiment is not limited thereto.

In addition, a current blocking area (not shown) is formed between the second conductive semiconductor layer 50 and the conductive support substrate 80 in such a manner that the current blocking area may at least partially overlap with the first electrode 60. The current blocking area can be formed by using an electric insulating material or a material having electric conductivity lower than that of the conductive support substrate 80 or can be formed by applying plasma damage to the second conductive semiconductor layer 50. The current may be widely spread due to the current blocking layer, so that the light efficiency of the active layer 40 can be improved.

As described above, according to the light emitting device package of the embodiments, the effective refractive index of the luminescent layer is identical to or similar to the effective refractive index of the encapsulant layer, so that the color variation of the light emitted from the light emitting device can be effectively reduced.

A plurality of light emitting device packages according to the embodiments may be arrayed on the substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 7:
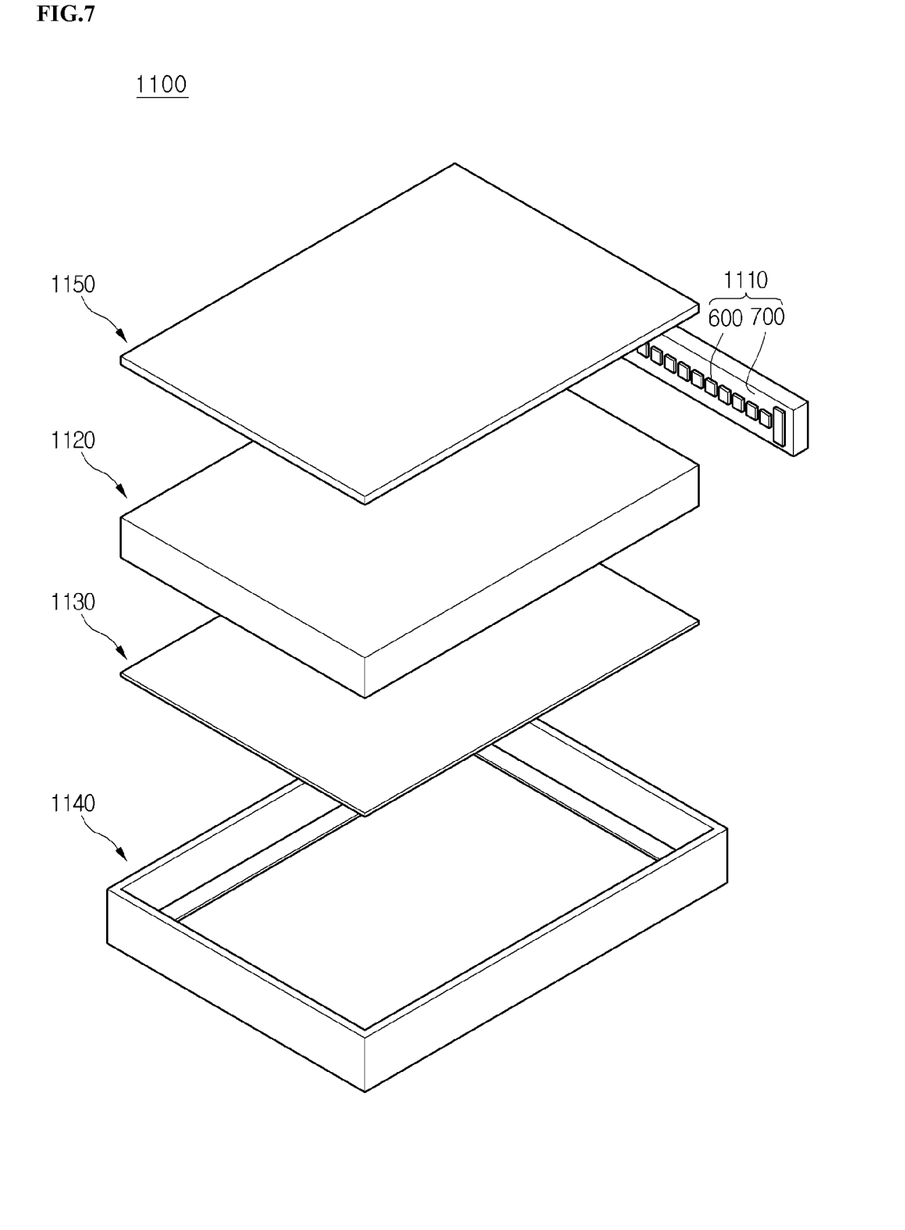
FIG. 7 is an exploded perspective view showing a backlight unit employing a light emitting device package according to the embodiments.

FIG. 7 is an exploded perspective view showing a backlight unit 1100 employing the light emitting device package according to the embodiments. The backlight unit 1100 shown in FIG. 7 is an example of a lighting system and the embodiment is not limited thereto.

Referring to FIG. 7, the backlight unit 1100 may include a bottom frame 1140, a light guide member 1120 provided in the bottom frame 1140, and a light emitting module 1110 installed at one side or on the bottom surface of the light guide member 1120. In addition, a reflective sheet 1130 may be disposed under the light guide member 1120.

The bottom frame 1140 has a box shape having an open top surface to receive the light guide member 1120, the light emitting module 1110 and the reflective sheet 1130 therein. In addition, the bottom frame 1140 may include a metallic material or a resin material, but the embodiment is not limited thereto.

The light emitting module 1110 may include a substrate 700 and a plurality of light emitting device packages 600 mounted on the substrate 700. The light emitting device packages 600 can supply light to the light guide member 1120. Although the light emitting module 1110 includes the light emitting device package 600 mounted on the substrate 700 according to the embodiment, the light emitting device 200 may be directly installed in the light emitting module 1110 according to another embodiment.

As shown in FIG. 7, the light emitting module 1110 is installed one at least one inner side of the bottom frame 1140 to provide the light to at least one side of the light guide member 1120.

In addition, the light emitting module 1110 can be provided under the bottom frame 1140 to provide the light toward the bottom surface of the light guide member 1120. Such an arrangement can be variously changed according to the design of the backlight unit 1100 and the embodiment is not limited thereto.

The light guide member 1120 is installed in the bottom frame 1140. The light guide member 1120 converts the light emitted from the light emitting module 1110 into the surface light to guide the surface light toward a display panel (not shown).

The light guide member 1120 may include a light guide plate. For instance, the light guide plate can be manufactured by using acryl-based resin, such as PMMA (polymethyl methacrylate), PET (polyethylene terephthalate), COC, PC (polycarbonate) or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet 1150 uniformly diffuses the light emitted from the light emitting module 1110 such that the diffused light can be concentrated onto the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmittive plate or a transmittive film including luminescence materials.

The reflective sheet 1130 can be disposed under the light guide member 1120. The reflective sheet 1130 reflects the light, which is emitted through the bottom surface of the light guide member 1120, toward the light exit surface of the light guide member 1120.

The reflective sheet 1130 may include resin material having a high reflectance, such as PET, PC or PVC resin, but the embodiment is not limited thereto.

Figure 8:
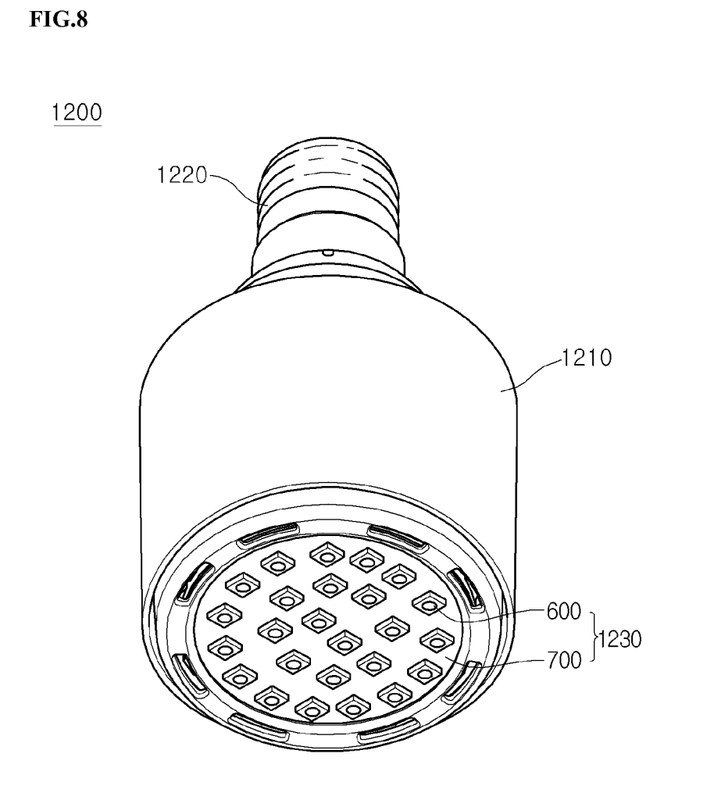
FIG. 8 is a perspective view showing a lighting unit employing a light emitting device package according to the embodiments.

FIG. 8 is a perspective view showing a lighting unit 1200 including the light emitting device package according to the embodiments. The lighting unit 1200 shown in FIG. 8 is only one example of the lighting system and the embodiment is not limited thereto.

Referring to FIG. 8, the lighting unit 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes a metallic material or a resin material.

The light emitting module 1230 may include the substrate 700 and at least one light emitting device package 600 installed over the substrate 700. Although the light emitting module 1110 includes the light emitting device package 600 mounted on the substrate 700 according to the embodiment, the light emitting device 100 may be directly installed in the light emitting module 1110 according to another embodiment.

The substrate 700 includes an insulating member printed with a circuit pattern. For instance, the substrate 700 includes a PCB (printed circuit board), an MC (metal core) PCB, a flexible PCB, or a ceramic PCB.

In addition, the substrate 700 may include a material that effectively reflects the light. The surface of the substrate 700 can be coated with a color, such as a white color or a silver color, to effectively reflect the light.

At least one light emitting device package 600 can be installed on the substrate 700. Each light emitting device package 600 may include at least one LED (light emitting diode). The LED may include a colored LED that emits light having the color of red, green, blue or white and a UV (ultraviolet) LED that emits UV light.

The light emitting module 1230 may have various combinations of light emitting devices to provide various colors and brightness. For instance, the white LED, the red LED and the green LED can be combined to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include a yellow luminescence material. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 8, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet is provided in the path of the light emitted from the light emitting module, so that the desired optical effect can be achieved.

As described above, the lighting system includes the light emitting device or the light emitting device package according to the embodiment, so that the light efficiency can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a body;
   first and second electrode layers on the body;

a light emitting device electrically connected to the first and second electrode layers on the body;
a first bump disposed between the light emitting device and the first electrode layer, the first bump directly contacting the light emitting device and the first electrode layer;
a second bump disposed between the light emitting device and the second electrode layer, the second bump directly contacting the light emitting device and the second electrode layer;
a luminescent layer on the light emitting device; and
an encapsulant layer including particles on the luminescent layer,
wherein an effective refractive index of the encapsulant layer has a deviation of 10% or less with respect to an effective refractive index of the luminescent layer,
wherein the luminescent layer entirely covers the light emitting device the first bump and the second bump, and a cross section of the luminescent layer is substantially formed of a square structure,
wherein the light emitting device package has a space region that is surrounded by the light emitting device, the first and the second bumps and the body and the space region is an empty region blocked by the luminescent layer,
wherein the luminescent layer is contacted with upper surfaces of the first and the second electrode layers in a vertical direction,
wherein the encapsulant layer is directly contacted with the luminescent layer and at least portions of the upper surfaces of the first and the second electrode layers, and
wherein a thickness of the luminescent layer is narrower than a thickness of each of the first and the second bumps.

2. The light emitting device package of claim 1, wherein the particles include metal oxide.

3. The light emitting device package of claim 1, wherein the particles include at least one selected from the group consisting of $TiO_2$, $Al_2O_3$, $TaO_2$, $CeO_2$ and silica.

4. The light emitting device package of claim 1, wherein the luminescent layer is formed on a surface of the light emitting device with a uniform thickness.

5. The light emitting device package of claim 1, wherein the luminescent layer is prepared as a film including luminescence materials and attached to a surface of the light emitting device.

6. The light emitting device package of claim 1, wherein the encapsulant layer is formed on the luminescent layer and the first and second electrode layers.

7. The light emitting device package of claim 1, wherein the encapsulant layer has a convex top surface.

8. The light emitting device package of claim 1, wherein the effective refractive index of the luminescent layer is 1.6 to 1.8 and the effective refractive index of the encapsulant layer is 1.44 to 1.98.

9. The light emitting device package of claim 1, wherein the luminescent layer is directly contacted with an upper surface and lateral sides of the light emitting device.

10. A light emitting device package comprising:
a body;
first and second electrode layers on the body;
a light emitting device electrically connected to the first and second electrode layers on the first and second electrode layers;
a first bump disposed between the light emitting device and the first electrode layer, the first bump directly contacting the light emitting device and the first electrode layer;
a second bump disposed between the light emitting device and the second electrode layer, the second bump directly contacting the light emitting device and the second electrode layer;
a luminescent layer having a uniform thickness on the light emitting device; and
an encapsulant layer including particles on the luminescent layer,
wherein the luminescent layer entirely covers the light emitting device, the first bump and the second bump, and a cross section of the luminescent layer is substantially formed of a square structure,
wherein the light emitting device package has a space region that is surrounded by the light emitting device, the first and the second bumps and the body and the space region is an empty region blocked by the luminescent layer,
wherein the luminescent layer is contacted with upper surfaces of the first and the second electrode layers in a vertical direction,
wherein the encapsulant layer is directly contacted with the luminescent layer and at least portions of the upper surfaces of the first and the second electrode layers, and
wherein a thickness of the luminescent layer is narrower than a thickness of each of the first and the second bumps.

11. The light emitting device package of claim 10, wherein the particles include metal oxide.

12. The light emitting device package of claim 10, wherein the particles include at least one selected from the group consisting of $TiO_2$, $Al_2O_3$, $TaO_2$, $CeO_2$ and silica.

13. The light emitting device package of claim 10, wherein the luminescent layer is prepared as a film including luminescence materials and attached to a surface of the light emitting device.

14. The light emitting device package of claim 10, wherein the encapsulant layer is formed on the luminescent layer and the first and second electrode layers.

15. The light emitting device package of claim 10, wherein the effective refractive index of the luminescent layer is 1.6 to 1.8 and the effective refractive index of the encapsulant layer is 1.44 to 1.98.

16. The light emitting device package of claim 10, wherein the encapsulant layer has a convex top surface.

17. The light emitting device package of claim 10, wherein the luminescent layer is directly contacted with an upper surface and lateral sides of the light emitting device.

* * * * *